(12) United States Patent
Machiroutu et al.

(10) Patent No.: US 6,595,270 B2
(45) Date of Patent: Jul. 22, 2003

(54) USING MICRO HEAT PIPES AS HEAT EXCHANGER UNIT FOR NOTEBOOK APPLICATIONS

(75) Inventors: Sridhar V. Machiroutu, Santa Clara, CA (US); Joseph D. Walters, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/895,308

(22) Filed: Jun. 29, 2001

(65) Prior Publication Data

US 2003/0000682 A1 Jan. 2, 2003

(51) Int. Cl.[7] .............................................. F28D 15/00
(52) U.S. Cl. ........................ 165/104.26; 165/104.33; 361/700; 174/15.2
(58) Field of Search .................. 165/80.4, 104.26, 165/104.33, 185; 29/890.032; 361/700; 174/15.2; 257/715, 716

(56) References Cited

U.S. PATENT DOCUMENTS

| | | | | |
|---|---|---|---|---|
| 4,675,783 A | * | 6/1987 | Murase et al. ............. | 174/15.2 |
| 4,921,041 A | * | 5/1990 | Akachi ................... | 165/104.26 |
| 5,219,020 A | * | 6/1993 | Akachi ................... | 165/104.26 |
| 5,309,457 A | * | 5/1994 | Minch ......................... | 372/34 |
| 5,329,993 A | | 7/1994 | Ettehadieh | |
| 5,651,414 A | * | 7/1997 | Suzuki et al. ........... | 165/104.26 |
| 5,960,866 A | * | 10/1999 | Kimura et al. ........... | 165/104.33 |
| 5,982,616 A | * | 11/1999 | Moore ........................ | 361/700 |
| 6,041,850 A | * | 3/2000 | Esser et al. ................ | 174/15.2 |
| 6,102,110 A | * | 8/2000 | Julien et al. ............. | 165/104.33 |
| 6,105,662 A | | 8/2000 | Suzuki | |
| 6,111,749 A | | 8/2000 | Lamb et al. | |
| 6,269,865 B1 | | 8/2001 | Huang | |
| 6,437,983 B1 | * | 8/2002 | Machiroutu et al. ........ | 361/700 |

\* cited by examiner

*Primary Examiner*—Henry Bennett
*Assistant Examiner*—Terrell McKinnon
(74) *Attorney, Agent, or Firm*—David N. Tran

(57) ABSTRACT

A system including a plurality of micro heat pipes is used to transfer heat from a die. A die attach block is coupled with the die. The plurality of micro heat pipes (MHPs) are attached to the die attach block to enable the MHPs to be in close contact with the die to absorb heat generated by the die.

24 Claims, 4 Drawing Sheets

USING MICRO HEAT PIPES AS HEAT EXCHANGER UNIT FOR NOTEBOOK APPLICATIONS

FIELD OF THE INVENTION

The invention is related to the field of thermal technology, and more specifically to cooling computing systems.

BACKGROUND

Electronic components from microprocessors to high-end power converters generate heat. The rejection of this heat is necessary for their optimum and reliable operation. As electronic design allows higher throughput in smaller packages, dissipating the heat load becomes a critical design factor.

There are different ways of dissipating heat. These include radiation, conduction and convection. Radiation means that the heat is simply radiated away from the object, through electromagnetic radiation. Conduction is the exchange of kinetic energy between molecules. Less energetic (lower temperature) particles gain kinetic energy by colliding with more energetic particles (through physical contact).

Convection is heat transfer by movement of a heated substance (gas or liquid). This means that the heat is transferred to the molecules of the gas (or liquid) surrounding the hot object, and then transported away through movement of molecules. When the gas or liquid around the object is forced into movement (e.g., by a fan blowing air across a heat sink), then it is forced convection. Many of today's electronic devices require cooling beyond the capability of standard metallic heat sinks.

A heat pipe is a type of cooling device where heat is decapitated by forced convection. A heat pipe is essentially a passive heat transfer device with an extremely high effective thermal conductivity. The heat pipe in its simplest configuration is a closed, evacuated cylindrical aluminum or copper vessel with internal walls lined with a capillary structure or wick that is saturated with a working fluid. The working fluid enters the pores of the wicking material, wetting all internal surfaces. Since the heat pipe is evacuated and then charged with the working fluid prior to being sealed, the internal pressure is set by the vapor pressure of the fluid.

As heat enters the heat pipe at an evaporator end of the heat pipe, the heat causes the working fluid to vaporize. The vaporized fluid creates a pressure gradient, which forces the vapor to flow along the pipe to a cooler section (a condenser end of the heat pipe) where it condenses giving up its latent heat of vaporization. The working fluid is then returned to the evaporator end of the heat pipe by capillary forces developed in the wick structure. The wicking material serves as a pump to return the cooled working fluid from the condenser end.

Heat pipes can be designed to operate over a very broad range of temperature. In electronic cooling applications where it is desirable to maintain junction temperatures below 125–150 degrees Celsius, copper/water heat pipes are typically used. There are many factors to consider when designing heat pipe including the amount of power the heat pipe is capable of transferring and the effective heat pipe thermal resistance.

Heat pipes can be built in different sizes, shapes and materials to accommodate different application geometries. Using heat pipes is advantageous in space-constrained systems. For example, in mobile computing systems, there isn't enough space to put a heat exchanger on top of a microprocessor to dissipate heat. The heat pipe transfers the heat with minimal drop in temperature and allows the heat exchanger to be placed elsewhere in the mobile computing system.

Current applications of the heat pipes include cooling Pentium processors in notebook computers, especially in notebook computers, due to the limited space and power. However, the application of the heat pipe in the notebook computers is limited to using a single large heat pipe. The large heat pipe is connected to a thermal attach block which is connected to a die. However, the single large heat pipe does not provide efficient cooling. In addition, the single large heat pipe is not flexible enough to accommodate different space and size constraints.

BRIEF DESCRIPTION OF THE DRAWINGS

The present invention is illustrated by way of example, and not limitation, in the figures of the accompanying drawings in which.

DETAILED DESCRIPTION

In one embodiment, a method of and a system for using multiple micro heat pipes to dissipate heat in computing systems are disclosed. Each of the multiple micro heat pipes is attached to a thermal attach block to be in close contact with a heat-generating device.

The following detailed description sets forth numerous specific details to provide a thorough understanding of the invention. However, those of ordinary skill in the art will appreciate that the invention may be practiced without these specific details. In other instances, well-known methods, procedures, protocols, components, algorithms, and circuits have not been described in detail so as not to obscure the invention.

Figure 1:
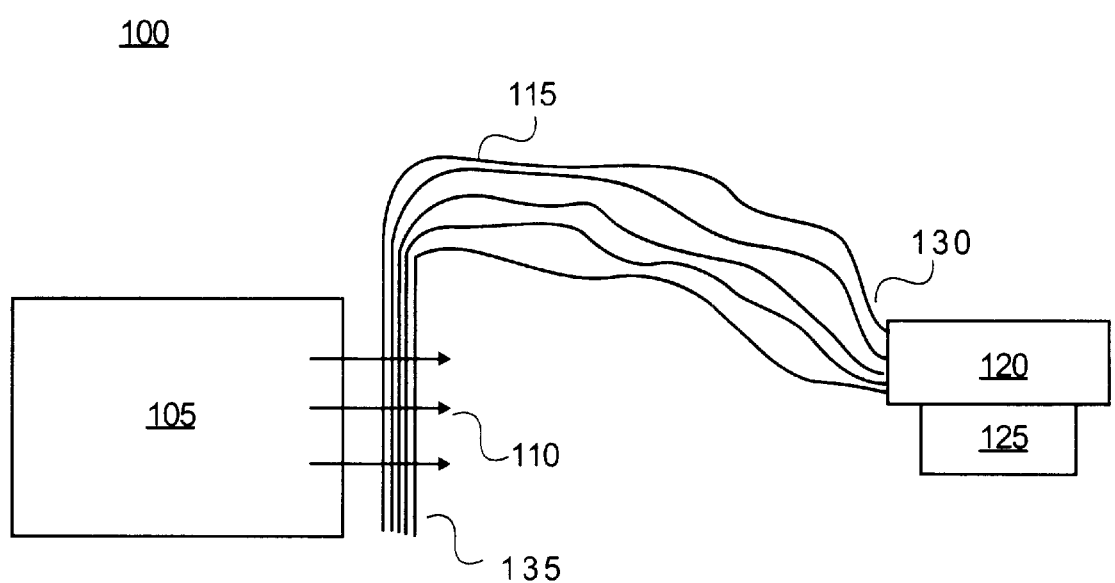
FIG. 1 is a diagram illustrating a heat dissipation system using multiple micro heat pipes (MHPs).

FIG. 1 is a diagram illustrating a heat dissipation system using multiple micro heat pipes. The heat dissipation system 100 typically includes a fan 105 for generating air flows 110 across the multiple micro heat pipes (MHPs) 115. In one embodiment, each of the multiple MHPs used in the present invention has a small cross-section. The cross-section of the MHP may have a length of up to 1 millimeter (mm).

Each of the MHPs 115 has a central insulated section made of flexible material (e.g., plastics, etc.). The small cross section and the flexible material allow the MHPs 115 to easily conform to space and size constraints of a mobile computing system (e.g., laptops). The central insulated section reduces convection and radiation from the MHPs 115 in regions undesired. Internal operations of the MHPs 115 are similarly to those of the standard heat pipes including the capillary wicking material, the working fluid, the wetting of internal surfaces, and the vaporization and the condensation of the working fluid.

In another embodiment, each of the MHPs 115 has two metallic ends 130, 135 using materials such as, for example, copper, aluminum, etc. The two metallic ends 130, 135 may be sealed. This allows the MHP to operate as a closed heat pipe system enabling the working liquid to boil and evaporate inside the MHP.

Referring to FIG. 1, the metallic end 130 is used for heat absorption (or energy intake) by evaporation of the MHP working fluid. The metallic end 135 is used for heat release (or energy loss) by condensation of the MHP working fluid. For example, when the thermal attach block 120 is attached to the die 125 (e.g., a microprocessor chip), the MHPs 115 assist with the dissipation of heat generated by the die 125 by absorbing the heat at metallic ends 130 (or evaporation ends) and releasing the heat at metallic ends 135 (or condensation ends).

Figure 2A:
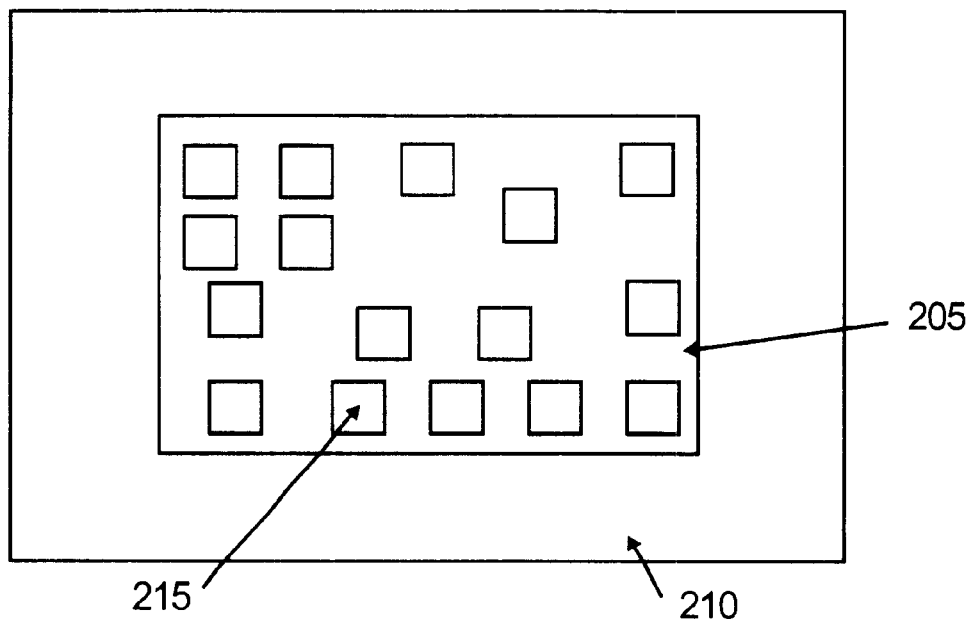
FIGS. 2A and 2B are diagrams illustrating one example of MHPs-to-thermal attach in vertical configuration.
Figure 2B:
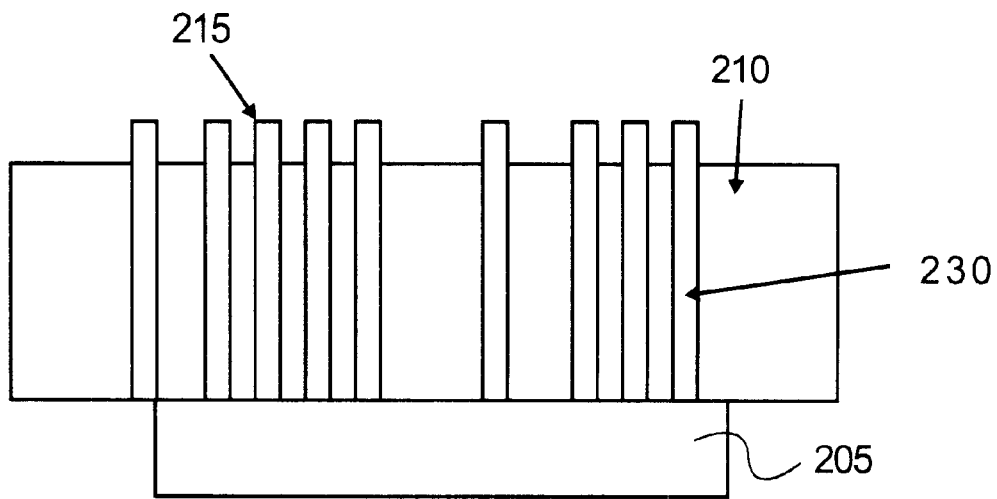

FIGS. 2A and 2B are diagrams illustrating one example of attaching multiple MHPs to a thermal attach block in a vertical configuration. FIG. 2A illustrates a top view of the vertical configuration, while FIG. 2B illustrates a side view of the vertical configuration. In one embodiment, since the evaporation ends of the MHPs 215 may not be connected directly to the die 205 (e.g., the microprocessor chip) by themselves, the thermal attach block (or die attach block) 210 is used to hold the evaporation ends 230. This makes it easier to place the multiple MHPs 215 to be in contact with the die 205. Of course, other methods may also be used to hold the evaporation ends 230 of the multiple MHPs 215 to achieve placing the evaporation ends 230 in contact with the die 205. As the die generates heat, the heat is absorbed by the evaporation ends 230 of the MHPs 215. The thermal attach block 210 may be made of metal (e.g., copper).

Typically, the die 205 may generate heat non-uniformly. For example, in an area of the die 205 where there is a high density of transistors, more heat may be generated than areas with less density. Since each of the MHPs 215 has a small cross section, the corresponding evaporation end 230 is also small. In addition, since there are multiple MHPs 215, each of the MHPs 215 may be placed in contact with the die 205 non-uniformly at different areas of the die 205. For example, more MHPs 215 can be placed near the area of the die 205 that generate more heat to provide more efficient heat absorption. Those MHPs from hotter locations can then be provided better cooling than those MHPs from cooler locations (by positioning different fan/fin locations for the condensation ends). Thus, by using a heat dissipation system having multiple MHPs instead of a single larger heat pipe, the system is more sensitive to heat generating behavior of the different areas of the die 205 thereby providing more efficient heat dissipation.

Figure 3A:
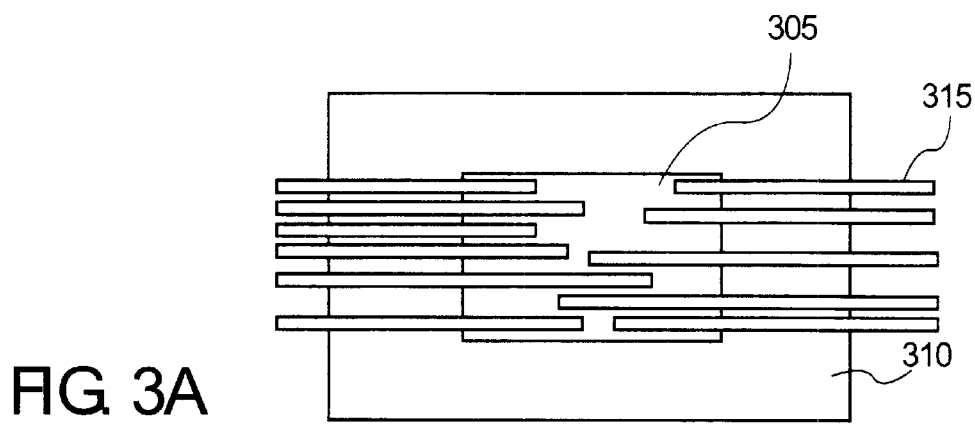
FIGS. 3A and 3B are diagrams illustrating one example of MHPs-to-thermal attach in horizontal configuration.
Figure 3B:
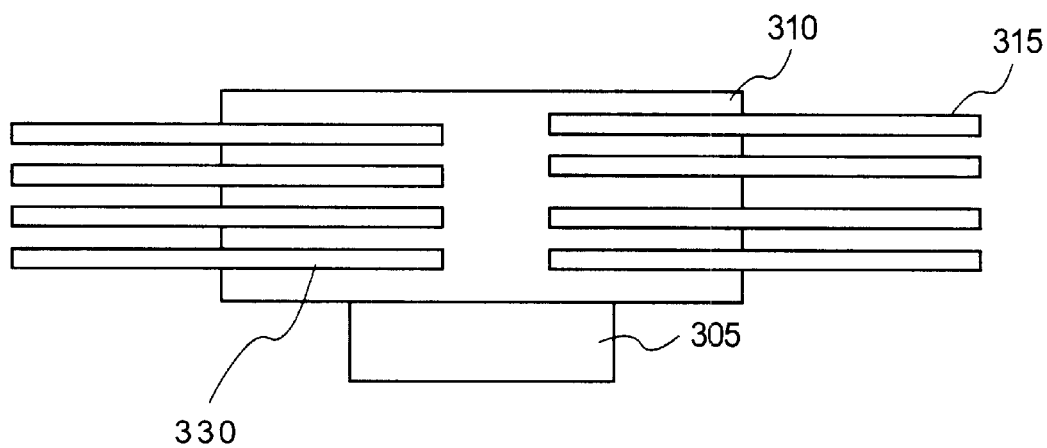

FIGS. 3A and 3B are diagrams illustrating one example of attaching multiple MHPs to a thermal attach block in a horizontal configuration. FIG. 3A illustrates a top view while FIG. 3B illustrates a side view. The thermal attach block 310 helps hold the evaporation ends 330 of the MHPs 315 in place. The thermal attach block 310 allows the evaporation ends 330 of the multiple MHPs 315 to be as close to the die 305 as possible.

As described above, the MHPs 315 may be placed in the thermal attach block based on heat generated by different areas of the die 305 to provide more efficient heat absorption. Those MHPs from hotter locations can then be provided better cooling than those MHPs from cooler locations. The horizontal configuration may be used in computing systems having limited vertical space.

Figure 4:
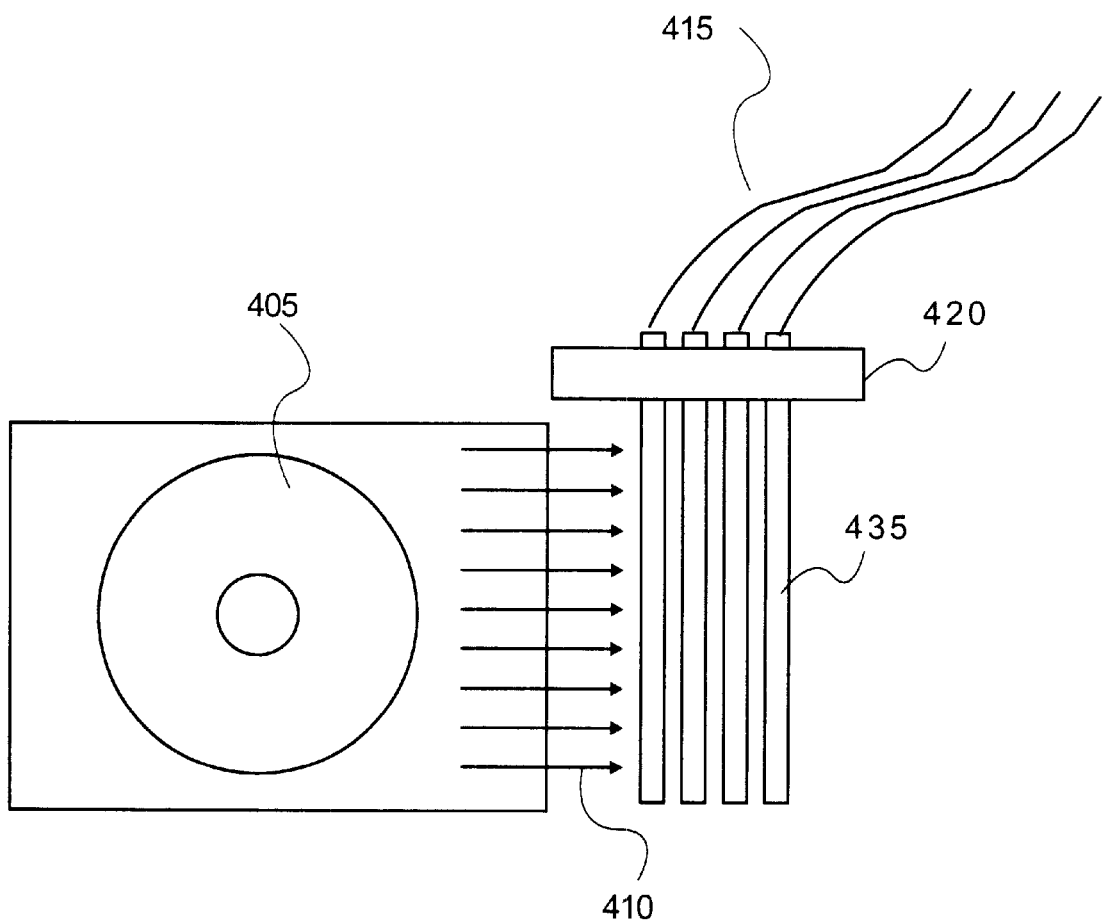
FIG. 4 is a diagram illustrating one example of using MHPs as a heat exchanger.

FIG. 4 is a diagram illustrating one example of using MHPs as a heat exchanger. Typically, when using the heat pipe to transfer heat, the condensation end of the heat pipe is attached to a heat exchanger (not shown). In one embodiment of the present invention, the metallic condensation ends 435 of the multiple MHPs are used as the heat exchanger by applying airflow around the condensation ends 435. This eliminates the need for the heat exchanger. For example, the condensation ends 435 may be attached to a holder 420 and strategically placed in an area to receive the airflow 410 from a fan 405. The multiple MHPs 415 may need to be aligned to allow sufficient airflow to go around the condensation ends 435. The airflow 410 serves to cool the condensations ends 435 thereby reducing the vapor into the working liquid to be pulled back to the evaporation ends (not shown) of the multiple MHPs 415.

Although the invention has been described with notebook applications, one skilled in the art would recognize that the flexible MHPs may also be applied to other applications to provide more efficient heat dissipation and/or to conform with space and size constraints.

From the above description and drawings, it will be understood by those of ordinary skill in the art that the particular embodiments shown and described are for purposes of illustration only and are not intended to limit the scope of the invention. Those of ordinary skill in the art will recognize that the invention may be embodied in other specific forms without departing from its spirit or essential characteristics. References to details of particular embodiments are not intended to limit the scope of the claims.

What is claimed is:

1. A system, comprising:
   multiple micro heat pipes (MHPs) each having a first end and a second end, a central flexible section having wicking internal surface carrying a liquid, the first end placed in contact with a die to transfer heat generated by the die to a heat exchanger using the liquid; and
   a thermal attach block coupled to the die, wherein the first end of each of the multiple MHPs is attached to the thermal attach block to enable the first end to be placed in contact with the die.

2. The system of claim 1, wherein the first end is an evaporation end and the second end is a condensation end, both of metallic material.

3. The system of claim 2, wherein the condensation end is attached to the heat exchanger.

4. The system of claim 2, wherein the condensation end is the heat exchanger by applying airflow to the condensation end.

5. A system, comprising:
   a die;
   a die attach block coupled to the die; and
   a plurality of micro heat pipes (MHPs) attached to the die attach block to enable the MHPs to be in close contact with the die to absorb heat generated by the die, each of the MHPs comprising a condensation end and an evaporation end, wherein the evaporation end is attached to the die attach block to be in close contact with the die.

6. The system of claim 5, wherein each of the MHPs has a cross section having a length of up to 1 mm.

7. The system of claim 5, wherein each of the MHPs further comprises a central insulated section made of flexible material, the central insulated section having an internal surface in a shape to provide capillary action.

8. The system of claim 5, wherein the evaporation end and the condensation end are metallic.

9. The system of claim 8, wherein the condensation end of the MHP is attached to a heat exchanger.

10. The system of claim 8, wherein the condensation end of the MHP is used as a heat exchanger by applying air flow to the condensation end.

11. The system of claim 5, wherein being in close contact with the die includes being in direct contact with the die.

12. A system, comprising:

means for placing multiple micro heat pipes (MHPs) to be in contact with a die to absorb heat from the die, each of the MHPs having a first end, a second end, and a central flexible section having wicking internal surface carrying a liquid, the first end placed in contact with a die to absorb the heat using the liquid.

13. The system of claim 12, wherein the first end and the second end are metallic.

14. The system of claim 13, wherein the second end is attached to a heat exchanger.

15. The system of claim 13, wherein the second end is used as a heat exchanger by applying airflow to the second end.

16. A method, comprising:

attaching evaporation ends of a plurality of micro heat pipes (MHPs) to a thermal attach block coupled to a die in a system, wherein the evaporation ends are positioned based on amounts of heat generated by different areas of the die.

17. The method of claim 16, wherein each of the MHPs has a cross section of up to 1 millimeter.

18. The method of claim 16, wherein each of the MHPs comprises a condensation end in addition to the evaporation end.

19. The method of claim 18, wherein each of the MHPs further comprises a central insulated section made of flexible material, the central insulated section having a capillary wicking internal surface.

20. The method of claim 19, wherein the evaporation end and the condensation end are metallic.

21. The method of claim 20, wherein the condensation end of each of the MHPs is attached to a heat exchanger.

22. The method of claim 20, wherein the condensation end of each of the MHPs is used as a heat exchanger by applying air flow to the condensation end.

23. The method of claim 16, wherein the evaporation ends are vertically attached to the thermal attach block.

24. The method of claim 16, wherein the evaporations ends are horizontally attached to the thermal attach block.

* * * * *